United States Patent [19]
Heep et al.

[11] Patent Number: 5,396,168
[45] Date of Patent: Mar. 7, 1995

[54] DIGITAL MULTIMETER WITH MICROPROCESSOR CONTROL

[75] Inventors: Jerry J. Heep, Weatherford; Frank P. Mimick, Watauga, both of Tex.

[73] Assignee: Tandy Corporation, Fort Worth, Tex.

[21] Appl. No.: 858,799

[22] Filed: Mar. 27, 1992

[51] Int. Cl.⁶ .................. G01R 1/00; G01R 19/26
[52] U.S. Cl. ..................... 324/115; 324/99 D
[58] Field of Search ........... 324/115, 116, 110, 99 D, 324/130, 114, 133; 364/483; 307/551; 361/56, 111

[56] References Cited

U.S. PATENT DOCUMENTS

| | | | |
|---|---|---|---|
| 3,790,886 | 2/1974 | Kurtin et al. | 324/99 D |
| 4,114,094 | 9/1978 | Cook | 325/115 |
| 4,255,706 | 3/1981 | Soojian | 324/115 |
| 4,271,391 | 6/1981 | Kmetz | 324/115 |
| 4,321,530 | 3/1982 | Kelly et al. | 324/115 |
| 4,329,641 | 5/1982 | Ikeda et al. | 324/115 |
| 4,382,227 | 5/1983 | Olivenbaum et al. | 324/115 |
| 4,438,498 | 3/1984 | Sekel et al. | . |
| 4,458,197 | 7/1984 | Robinson | . |
| 4,492,916 | 1/1985 | Johnson | . |
| 4,500,973 | 2/1985 | Ley | 364/483 |
| 4,520,310 | 5/1985 | Kelly et al. | 324/115 |
| 4,563,770 | 1/1986 | Lemelson et al. | . |
| 4,608,532 | 8/1986 | Ibar et al. | . |
| 4,734,639 | 3/1988 | Saletta et al. | 324/115 |
| 4,736,327 | 4/1988 | Power | . |
| 4,789,824 | 12/1988 | Henkelmann | 324/115 |
| 4,794,383 | 12/1988 | Havel | . |
| 4,864,512 | 9/1989 | Coulson et al. | . |
| 4,876,502 | 10/1989 | Verbanets et al. | 324/99 D |
| 4,897,599 | 1/1990 | Koslar | 324/130 |
| 5,119,019 | 6/1992 | George | 324/115 |
| 5,142,221 | 8/1992 | Meldrum et al. | 324/115 |

*Primary Examiner*—Vinh Nguyen
*Attorney, Agent, or Firm*—Winstead Sechrest & Minick

[57] ABSTRACT

A digital multimeter includes a microprocessor control and a keyboard input. The microprocessor functions to control the display of parameters measured by the meter and displays such measured parameters. The keyboard includes switches to allow the user to select a parameter which is desired to be measured as well as a range of values for that parameter for use in measuring parameters of a device under test connected to the multimeter. The microprocessor communicates with the keyboard and functions to control a resistor and switch network to configure the multimeter to test selected parameters within selected ranges. The multimeter incorporates an overload protection function which compensates for an over-large voltage on the input leads of the multimeter, thus preventing damage to the circuit and to the multimeter.

25 Claims, 1 Drawing Sheet

DIGITAL MULTIMETER WITH MICROPROCESSOR CONTROL

BACKGROUND OF THE INVENTION

This invention relates to digital measuring devices which have multiple functions. In the testing of electrical components of a device under test, including circuit components, it is desirable to use a single instrument for performing measurements of a number of parameters such as voltage, current, resistance and capacitance. These meters are referred to as multimeters. With the advent of digital technology, digitally controlled multimeters have been developed and are known as digital multimeters (DMM). Known digital multimeters will, under the control of a microprocessor or other program controller, control the measurement of a specific characteristic of a device under test. When the measurement of the parameter has been completed, the result is either printed or, more commonly, displayed on a display such as a liquid crystal or other display screen. In certain prior art devices, a microprocessor included with the device only functioned to control the liquid crystal or other screen of the display device. Digital technology was not used to control the selection of parameters to be measured of the device under test. More recently, however, as shown in U.S. Pat. Nos. 4,864,512, issued Sep. 5, 1989 to K. A. Coulson et al., and entitled "Measurement Apparatus with Plural Displays of Measured Parameter and Selectable Function Thereof" and U.S. Pat. No. 4,794,383, issued Dec. 27, 1988 to Karel Havel, and entitled "Variable Color Digital Multimeter", the microprocessor or other program controller has been used to both drive the display as well as to control at least some of the functions in the apparatus in the course of measuring one or more predetermined parameters of a device under test.

A problem common both to digital multimeters as well as to older version analog multimeters is that of potential overloading of the sensitive circuits within the multimeter. Such overloading may come as a result of connection by the user of the apparatus to a voltage or current source with a magnitude greater than the capability of the circuitry within the multimeter to handle. For example, in one type of prior art multimeters, prior to measuring a parameter of a device under test, the user must attach electrical leads, usually two, to the device under test. The other ends of the leads are connected to the multimeter, which has a plurality of lead sockets to accept the leads from the device under test. The sockets will correspond to a range of a parameter, such as voltage. A typical voltage range for one socket may be from 0 to 15 volts, whereas the next socket may be for voltage ranging from 0 to 150 volts. If the user were to connect the leads to activate the circuit within the multimeter corresponding to measurement of the voltage within the 0 to 15 volt range, and if the user was further unaware that the voltage in the device under test exceeded 1000 volts, connection of the leads and activation of the multimeter would in all likelihood result in damage and burnout of the circuit components, making the multimeter useless and in need of replacement.

Other multimeters may employ a rotary switch in lieu of the lead sockets. The rotary switch is used, in lieu of movement of leads into sockets on the multimeter body, to select the range of voltages or current within which the user expects the device under test to fall. Once again, if the device under test exceeds the range selected by the user, damage and potential destruction of the rotary switch and the circuitry within the multimeter is a very real possibility.

Another shortcoming of prior art multimeters is their inability to readily measure more than one parameter of a device under test without either moving leads into different sockets in the multimeter body in the first type described above or by moving the rotary switch to the appropriate setting in the second type described above. Thus, in the prior art, if a user measured the voltage of a device under test and then wished to measure the current of that same device, the user would, while holding the multimeter in one hand, use the other hand to turn the rotary switch from the voltage setting to the current setting. Furthermore, in the prior art devices, with the need for a rotary or slide switch to allow for the selection of ranges and parameters to be measured, the overall expense of the multimeter is increased. The use of mechanical rotary or slide switches does not fully utilize the capability of a microprocessor or other program controller (driving the display screen only) to perform the function of shifting parameters to be measured (from voltage measurement to current measurement, for example). If too high a voltage or current is passed into the multimeter due to the user incorrectly setting or positioning the rotary switch, the digital circuitry will be damaged, often requiring replacement of the entire multimeter.

SUMMARY OF THE INVENTION

In accordance with the present invention, a microprocessor, under control of a keyboard or other input device, performs multiple functions. As in prior art devices, the microprocessor will provide a control to a liquid crystal or other display to display the value of the parameters measured from the device under test. In addition, the microprocessor under control of a keyboard or other input device, will control the selection of a parameter such as voltage, current, resistance capacitance or other parameter to be measured. The digital multimeter of the present invention allows the user to connect leads to any device under test regardless of the voltage or current value of the device. Furthermore, under control of the microprocessor, an auto ranging feature embodied in the present invention will cause the microprocessor to control a resistor and switch network to select the appropriate range for measurement of the desired parameter without risking burnout or damage to the internal circuitry of the multimeter. The multimeter of the present invention permits, through microcomputer control, switching from one parameter to another parameter simply by actuating the respective keyboard or other input, eliminating the need to make adjustments to the rotary or slide switches. The multimeter of the present invention provides an overload protection feature to protect tile circuitry in the multimeter and is embodied in a compact handheld instrument which allows one-hand use to facilitate ease of usage.

It is therefore an object of the present invention to provide a digital multimeter device which allows control of the selection of parameters and the range of parameters to be measured under microprocessor control.

It is another object of the present invention to provide an overload prevention means in the multimeter to prevent burnout or damage to the multimeter caused by too high a voltage being connected to the multimeter through an input terminal.

It is yet another object of the present invention to provide an auto ranging feature whereby the range of the parameter to be measured, if not selected by the user, will be automatically determined by the microprocessor without intervention of the user and without the danger of overloading and consequent damage to the circuits within the multimeter.

It is yet another object of the present invention to provide a multimeter which allows for rapid sequential measurement of different parameters of a device under test without having to use cumbersome rotary slide switches, and only requiring activation of buttons on the keyboard.

It is still another object of the present invention to provide a compact handheld multimeter which can be manipulated without the use of both hands and which is less expensive in construction.

In accordance with the present invention, a multimeter is provided with a keyboard. The keyboard is connected to and communicates with a the microprocessor. The microprocessor controls a resistor and switch network. The resistor and switch network receives inputs from the device under test and includes a connection to a number of terminals for inputs for measuring DC voltage, AC voltage, current resistance and capacitance. These terminals are connected to leads which leads are in turn connected to the device under test.

A problem present in prior art multimeters is that if an excessive voltage or current is imposed on the leads, the multimeter circuitry may burn out or at least be damaged, requiring replacement of the multimeter. In the present invention a resistive network connected to clamping circuits will cause excessive voltage to go to ground, thus preventing passage of excessive voltage to the circuitry within the multimeter. The microprocessor will sense the magnitude of the voltage or current and will automatically connect and disconnect switches within the resistive network to an appropriate range of values so that the circuitry Of the system may effectively measure the parameter desired.

DETAILED DESCRIPTION OF THE PREFERRED EMBODIMENT

Digital multimeters of the prior art and in the present invention are conventionally enclosed within a unitary housing having some means to display results of measurement, which may either be an analog needle gauge or a digital readout. Multimeters typically include an input device which allows the operator to select the type of measurement desired and a range button or switch which allows the user to select a particular range, for example, a voltage range of between 0 and 150 volts, and a number of other input terminals or sockets in the body of the multimeter. These sockets or terminals are adapted to receive leads which are in turn attached to or placed in contact with the device under test. With certain multimeters of current design, a parameter such as voltage will be displayed on the analog dial corresponding to the voltage measured.

Figure 1:
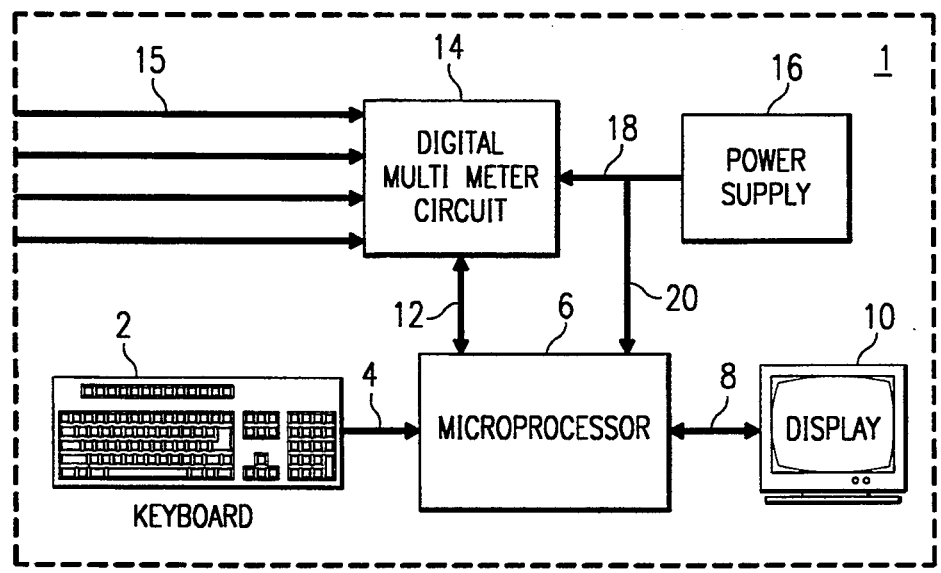
FIG. 1 is a block diagram of a digital multimeter of the present invention.

Referring now to FIG. 1, there is shown in a block diagram the overall system of the present invention. The various components are housed within a housing 1 which may be of any suitable shape and size to receive and package the components, a function selection unit and a display unit. Within the housing unit 1 of FIG. 1, a selection unit in the form of a keyboard 2 is located. Keyboard 2 may comprise a number of pushable or slidable buttons or switches which correspond to various functions to be tested or various ranges within which the test ought to be performed. Instead of a number of push buttons, toggle switches or pressure sensitive or heat sensitive switches may be used. For example, the buttons or switches on the keyboard 2 may be individually marked with the particular function they control, such as VDC, for the button or control which actuates the function of testing DC voltage; VAC for the button which controls the function of testing for AC voltage, OHMS for the function which controls the measurement of resistance of a device under test; CAP for the button which controls the measurement of capacitance of a device under test, etc. In addition, buttons may be marked with a series of numbers corresponding to the range within which measurements are taken.

The keyboard or keypad 2 communicates with a programmable controller in the form of a microprocessor 6 shown in FIG. 1 through a communication line 4 (which may be a serial or parallel connection well known in the art) to microprocessor 6. The microprocessor 6, which may be of any suitable design, performs two main functions. Its first function is to display the results of measurements taken using the multimeter on a display 10, communicated to display 10 through a communication line 8. Communication line may be a conventional parallel or a serial connection, as desired and appropriate. Display 10 which may be a liquid crystal display, or another suitable display, or a printer of suitable design, which will display or print the results of the measurements taken by the digital multimeter of the device under test. The display 10 may also be used to display error codes, low battery condition, faulty connection of leads to the device under test, etc. Time of day and date may also be displayed on the display 10, if desired.

Microprocessor 6 performs a second function, and that is to receive information through means to be described below from the device under test and to then display those results. As shown in FIG. 1, a connection or interface 12 connects the microprocessor 6 to a digital multimeter circuit 14 which may be in the form of discrete circuit elements or of an integrated circuit. The interface may be a parallel or serial connection, as desired and appropriate. The digital multimeter circuit 14 performs the functions of receiving information in the form of data corresponding to magnitude of a parameter (AC voltage level, for example) from a plurality of test leads 15 and processing the data which are usually in analog form, and converting it into digital form to be processed by the microprocessor 6. Thus, the magnitudes measured by the digital multimeter circuit 14 are forwarded in a digital form over link 12 to the microprocessor for processing. A power supply 16 shown in FIG. 1 provides power through leads 18 and 20 to the multimeter 14 and microprocessor 6, respectively.

Figure 2:
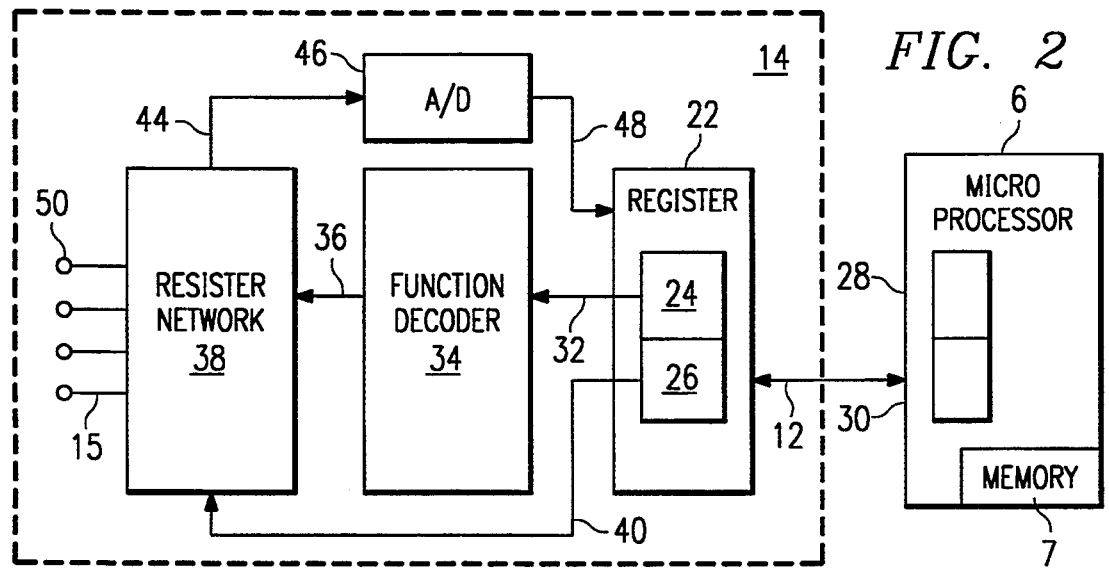
FIG. 2 is a block diagram which illustrates the control for a resistor and switch network.

FIG. 2 shows in greater detail the structure and operation of the digital multimeter circuit 14 shown in the block diagram of FIG. 1. As explained in connection with FIG. 1, the microprocessor 6 communicates with the digital circuit 14 over an interface line 12. For purposes of illustration only, however, interface line 12 has been shown as a single communication line connecting the microprocessor 6 with an interface device 22.

When a user pushes one or more of the buttons or keys on the keyboard 2 shown in FIG. 1, the microprocessor 6 will send an instruction word through the interface device 22 over line 12, which may be 14 bit long word. In microprocessor 6, the 14 bit word is shown in FIG. 2 as being stored in latches 28 and 30. Seven of the bits in the instruction word stored in latch 28 define the function which the digital multimeter is instructed to perform, such as taking a voltage or a current measurement. The remaining seven bits of the instruction word contained in latch 30 define the range within which the function is to be determined by the first seven bits. The 14 bit word and the latches shown are for purposes of illustration only, and other instruction words of different bit lengths are considered equivalent to the arrangement shown and disclosed in this specification.

The interface device 22 may be a tristate register or any other suitable device. It may comprise two data lines arranged in a wired-AND configuration so that each device can signal the other device by forcing one of the two-wires into a "low" condition. Serial transfer of a predetermined numbers of bits in a digital word is delimited by start and stop bits which are, in turn, defined by their relation to a clock signal on one of the data lines. The start and stop bits are chosen to be in a particular state during the "active" portion of the clock signal. A interface device useful with the present invention is described in related copending application Ser. No. 07/858,855, entitled "Two Wire, Bidirectional data Bus and Method of Operation", by Jerry J. Heap and Douglas R. Curtis, the disclosure of which is incorporated by reference herein. Thus, through the action of keyboard 2, the user can cause the microprocessor 6 to instruct the digital multimeter circuit 14 to perform certain functions on the device under test within certain ranges of voltage, current, resistance or capacitance as desired. Therefore, the interface device 22 will contain information relating both as to the function to be measured and the range within which that measurement is to be taken. As will be described below, the interface device 22 also functions to forward information to microprocessor 6.

As shown in FIG. 2, the path between microprocessor 6 and interface device or register 22 is a serial path. In lieu of a serial path, a parallel data path may also be used as desired and as appropriate depending on the particular chip or circuitry used in implementing the connection and further dependent on the particular microprocessor utilized. The interface register 22 which receives the 14 bit word instruction from the microprocessor 6 over line 12 may contain two latches, a first latch 24 of seven bits corresponding to function selected and another seven bit register 26 corresponding to the range selected by the user through the microprocessor 6. The interface register 24 function instruction is carried by line 32 to a function decoder 34. Function decoder 34 may be any suitable register or other device to receive the particular function selected by the user and condition the resistor and switch network 38 (to be described below) through a communication line 36. In addition, interface register 26 will control the range of values to be measured through a communication or connection line 40, which is also connected to resistor switch network 38. Resistor network 38 acts in a conventional manner to convert the parameter to be measured into an analog voltage. The analog voltage is "divided down" by the network to a level which can be handles by the analog to digital convertor which may have a limited range.

Resistor network 38 may be constructed in a number of different ways. The resistor switch network may comprise an arrangement similar to that in a conventional rotary resistor arrangement used in prior art voltmeters and multimeters. The resistor arrangement may, alternatively, be in the form of a number of parallel spaced resistors with a slide switch connecting one or more of the resistors depending upon the range selected. Yet another type of resistor and switch network comprises a number of resistors and individual switches to the resistors, the opening and closing of the switches resulting in the connection and disconnection of desired resistors. In one such conventional resistor arrangement, shown in FIG. 51 of U.S. Pat. No. 4,794,383, discussed above, a rotary switch will come into contact with resistors of varying resistance. The particular resistance switch network utilized does not form part of the present invention, and it is only important that the network be configurable through instructions from microprocessor 6. The resistor and switch network 38 is connected to a number of inputs 15 to which the device under test are connected.

A resistor and switch network useful with the present invention and which can be configured by microprocessor 6 controlling a number of semiconductor switches is described in related copending application Ser. No. 07/859,142, entitled "Single Resistive Divider Network For a Digital Multimeter", by Paul T. Schreiber and Jerry J. Heep, the disclosure of which is incorporated by reference herein.

Certain one or more of the inputs 15 are connected to the device under test when performing a measurement of DC voltage or AC voltage, as is known in the prior art. Certain other inputs 15 are connected to a device under test when the current of the device under test is to be measured and still certain other inputs 15 may be connected when the capacitance of a device under test is to be measured, as is conventionally known. Signals from the microprocessor 6, through communication lines 36 and 40, will respectively select the particular input line to be activated, depending on the particular function or parameter to be measured, and the range in which that parameter is expected to fall. Once the function and the range have been selected and the measurement performed on the device under test through the appropriate one or more inputs of inputs 15, the results of that measurement will be communicated from the resistor and switch network 38 over line 44 to the analog to digital convertor 46. Following conversion to a digital form, the measurement in the form of digital data will be passed through line 48 to interface register 22 and subsequently to microprocessor 6. Microprocessor 6, upon receiving the result, will then cause the display 10 to display the results of the measurement.

At times the user may find it useful or necessary to have an input voltage to decibel conversion capability in a multimeter. Decibels may calculated relative to a fixed power level, and the unit "dbm" is a measurement of the power level of one signal relative to another. The multimeter of the present invention may include in the memory 7 a table of voltage values with each entry being associated with a given decibel value. The input voltage is compared with entries in the table to locate a first entry which is larger than the input voltage. A second entry having a lower value than the input voltage is then located in the table. A fractional value that is indicative of where the input voltage lies at a range between the first entry and the second entry is calculated using the first and second entries. The fractional value is added to a decibel value corresponding the second entry to produce a decibel value for the input voltage. Details of the operation and structure of a voltage to decibel convertor are contained in related copending application Ser. No. 07/858,814, entitled "Voltage to Decibel Converter Having Partial Table Lookup", by Jerry J. Heep, now U.S. Pat. No. 5,341,089 the disclosure of which is incorporated herein by reference.

Another aspect of the present invention relates to an "auto ranging" feature. This feature may be activated in the event that the user does not know the expected range within which the device under test is to fall. The user only has to select the function switch.

The purpose of providing a range selection, whether manual or automatic, is to increase responsiveness and sensitivity of measurement. For example, the ranges may have the values 0-15 volts, 0-150 volts and 0-1500 volts. If a voltage of a device under test is 15 volts, and if the multimeter is set to operate in the 0-1500 volts range, the precision of measurement may be less than if that same voltage were measured with the range selector set in the 0-15 volts range.

In the event that the user has not selected a range for a particular function whose value is to be measured on a device under test, but rather selects an "auto range" button or switch, the "auto ranging" feature of the present invention will be invoked. With the auto ranging feature, if the parameter of voltage of the device under test is to be measured, initially the microprocessor will send no instructions corresponding to the range selected. This causes interface register 22 to send no signal on line 40 to the resistor and switch network 38.

Thus, when the user pushes or selects the manual switch, a range appropriate to the particular parameter being measured will appear on the liquid crystal display as a result of instructions received from microprocessor 6. If the user desires a lower or upper range, depending on his knowledge of the device under test, another button or switch will increase the range or decrease the numerical value of the range. Once the range has been set, that range will be communicated from the microprocessor 6 through the interface register 22 and to the resistor and switch network 38 as discussed above. If, however, the user wishes, the "auto" switch may be selected. In that event, the microprocessor must implement a series of test measurements on the device under test to ascertain the range within which a usable measurement results. A program which controls the functioning of the auto ranging feature may be contained in a memory device 7 such as a Read Only Memory (ROM) which may be either internal or external to the microprocessor 6. The memory device 7 may also store other program functions, such as self-test and systems operations instructions. When the auto switch is selected, the microprocessor 6 will fetch instructions from the memory device 7. In the first instance, the microprocessor 6 will select a range for the purposes of determining the response of the device under test to that range. The range to be first selected may be the highest range possible with manual selection. Upon selection of the highest range, that range information will be fed to the interface device 22 through line 12. The resistor and switch network 38 will configure the resistor and switch network, and assumes that the device under test will respond to the highest range. For example, if the device under test is to have its voltage measured and the auto selector is actuated in the first instance, the resistor and switch network 38 is configured for a voltage in the range of 0-1500 volts. The result of that measurement will be passed along line 44 to the audio analog to digital converter 46 and line 48 and the interface 22 to the microprocessor 6. If in fact the voltage of the device was far less than 1500 volts, a zero, null or error reading would result. This would indicate to the microprocessor that the range selected was too high and that the voltage of the device under test did not fall within the first high range. The microprocessor 6 would then, under instruction from the memory device and the program contained therein, select the next lower range which for example might be 0-150 volts and once again measuring the voltage of the device under test. If the magnitude measured falls within the range of the selected range then the information received by the microprocessor 6 indicates the magnitude of such parameter and displays the numerical value on display 10.

Thus, on the face of the multimeter 1, a number of switches or buttons may be provided. It is to be understood that, in lieu of individual switches for each function, a two-position switch may be used. For example, in lieu of a separate button for volts and a button for amps or current, a single slide button may be provided, which in one position will provide the function of measuring amps and in the other position the function of measuring voltage. In addition, as described above, a ranging button may be comprised of a single button which in one position will function in the auto ranging configuration and in another a manual configuration in which the user will select the units and will select the range desired.

It will be understood that when auto ranging is selected, the microprocessor 6 may be programmed to display a nominal range number for a particular function being measured. For example, the nominal number for voltage may be 0 to 1500 volts. If the user desired to change the range, he or she would actuate either the range up or range down buttons, thus moving the range manually to the next higher or the next lower range. A further button or set of buttons would allow the user to select AC or DC operation measurement. A hold/release button may also be provided. In this configuration, the user may, by pressing a "hold" button, store a value just measured in the memory 7 connected with or integral with the microprocessor 6 for future reference or comparison with measurements of other devices under test.

Figure 3:
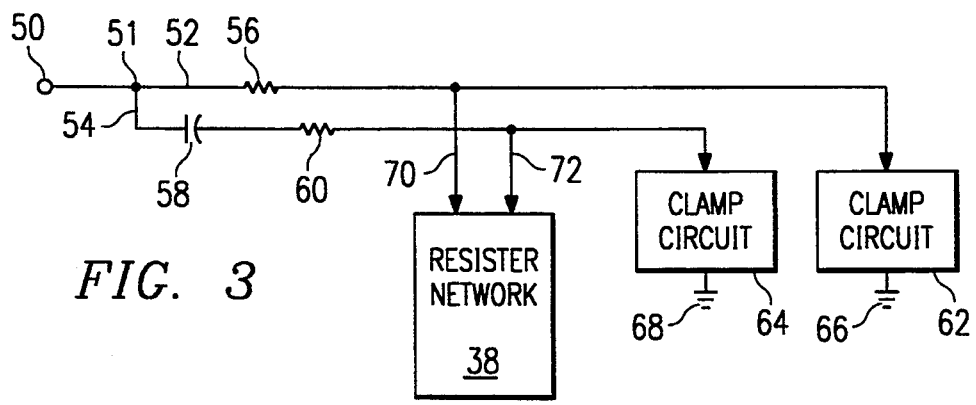
FIG. 3 is a block diagram illustrating an overload protection device for use with the multimeter of the present invention.

A feature of the device of the present invention is an overload protection feature, shown schematically in FIG. 3 of the drawings. One of the inputs 15 shown in FIG. 2 corresponds to an input to measure voltage of a device under test. This voltage input is shown as terminal 50 in FIG. 3. Another feature of the present invention is that both AC voltage and DC voltage may be connected to a common terminal 50 for measurement purposes. Terminal 50 branches out to two lines at node 51, line 52 (corresponding to DC voltage input) and line 54 (corresponding to AC voltage input). In prior art devices, the introduction of a overly large voltage on the AC or DC voltage input can cause damage to the circuitry contained in the multimeter, including the resistor and switch network, the microprocessor and associated circuitry. This may occur, for example, if the range selected by the user corresponds to 0–150 volts and the actual voltage measured exceeds 300 volts. Also, it is common for multimeters to have a "direct connect" from an input terminal to the measurement and conversion (analog to digital) circuitry to increase sensitivity in low ranges of values, thus bypassing the resistor network. This makes an over-voltage situation particularly dangerous to the multimeter circuitry. The particular resistor which may be contained in the prior art circuit for the selected range may be unable to drop the voltage sufficiently across the resistor to prevent damage to the circuitry within the multimeter.

In the present invention, on the DC input line 52, a large resistor such as a 10 meg ohm resistor 56 may be utilized. On the AC input line 54, a large resistance such as a 1 meg ohm resistance 60 may be employed together with a capacitor 58. The function of the capacitor 58 is to cause branching of DC voltage to the DC voltage line 52 and branching of AC voltage to the AC line 54. Due to this resistance difference, AC impedance will be less than DC impedance, and thus AC measurement performance will be good at high frequencies. Connected to DC line 52 and AC line 54 are two clamp devices 62 and 64. Each clamp device, which are device known in the prior art, is connected to ground, shown in reference numerals 66 and 68, respectively. A clamp device functions as a switch to pass a voltage through the clamped device and to ground once a certain level of voltage has been reached. A particular clamping circuit which is useful with the overload protection circuit of the present invention is described in related copending application Ser. No. 07/858,580, entitled "Overvoltage Protection for Battery Powered Equipment" by Jerry J. Heep and Douglas R. Curtis, the disclosure of which is incorporated herein by reference.

In the circuit shown in FIG. 3, if a large voltage is attached to voltage input terminal 50, the voltage exceeding a certain voltage (which may be predetermined by the circuit designer to be at a voltage level the circuitry of the multimeter can tolerate without damage to the circuit), will be dropped off to ground 66 by clamp 62. Similarly, too great a voltage on line 54 will cause the clamp 64 to conduct the excessive voltage to ground 68. Each of the lines 52 and 54 leads into a resistor and switch network, such as network 38 shown in FIG. 3, through lines 70 and 72, respectively. Through use of the overload circuit illustrated in FIG. 3, risk of damaging the resistor and switch network 38 and of the components of the multimeter is eliminated.

One further advantage of the arrangement shown in FIG. 3 is that the arrangement eliminates requiring two separate voltage inputs, one for AC voltage and the other for DC voltage, thus reducing the cost of the multimeter. In addition, the resistor and clamp arrangement shown in FIG. 3 eliminates the requirement of a high voltage switch in order to prevent damage to the circuitry of the multimeter.

An additional function available with the present invention is the facility of enabling the measurement of more than one parameter of a device under test. For example, the user may be interested in determining not only the voltage level but also the current value of a device under test. In prior art devices, it was necessary to manually move a rotary or slide switch to reconfigure the effective connection of the leads to the multimeter.

In the present invention, once the leads have been disconnected, if necessary, to measure one parameter and reconnected to measure another parameter, no other switching is required. The user merely pushes the other function button and the system will automatically configure itself to shift ranges and shift functions. This is accomplished through the circuit shown in FIG. 2 wherein change of function and change of range will be automatically implemented through the microprocessor and the function decoder to the resistor and switch network. In the prior art using a rotary type switch, after the leads had been shifted, if the meter had remained on and the user had rotated the rotary dial past the previously measured function, at least the resistors in the rotary dial and perhaps other circuit elements may have burned out or be otherwise damaged. Thus, the present invention provides for not only a very controllable setup for operation and measurement of a device under test but also provides for rapid shifting of functions without damaging elements within the multimeter. In addition, if the user wishes to simultaneously measure two parameters, such as current and voltage, the user will connect three leads to the device under test to measure volts and current the user merely needs to actuate first the volts and then the currents key to shift from calculation from one parameter to another. This feature is particularly useful in the event that the device under test may have a variable voltage output. As voltage of the device under test is varied, the user can observe the voltage change as measured by the multimeter while also tracking the change in current values. In prior art devices, using either a rotary or a slide switch, this would be impossible because the rotary or slide switch would disconnect the current path from the circuit from the device under test while it checked the voltage level.

In addition to the voltage and current parameters, it may be desirable to include within the multimeter the ability to measure other parameters. The user may desire to include a function to test transistors for various parameters, such as forward DC gain, the type of transistor, and identification of pins. A suitable input is attached to one or more additional input leads 15 of FIG. 2. The particular design of the terminal or sockets for contacting the pins of a transistor under test is not shown in the drawing but is known to those skilled in the art. In order to determine the forward DC gain ($H_{fe}$) of a transistor under test, the transistor having a first terminal, a second terminal and a third terminal, a diode check is performed between the first terminal and the second terminal of the transistor. A diode check is a simple test, known to those skilled in the art, for determining the existence and polarity of a single P–N junction in a semiconductor device. A diode check is also performed between the second terminal and the third terminal of the transistor. The transistor type and the base terminal of the transistor are identified in accordance with the results of the diode checks. Once the transistor type and base terminal are known, the DC voltage gain ($H_{fe}$) of the transistor may next be measured.

$H_{fe}$ may be measured by injecting a current into one unidentified terminal of the transistor, i.e. other than the base terminal. A current flows in the base terminal of the transistor, responsive to the current injected. This base current is measured. Furthermore, by alternatively injecting a current into the other unidentified terminal, and measuring the current flowing in the base terminal of the transistor, the forward $H_{fe}$ and the identities of the collector and emitter terminals may be determined. Details of the operation and structure of the transistor checker are contained in related copending application Ser. No. 07/858,860, entitled "Automatic Transistor Checker", by Paul T. Schreiber and Douglas R. Curtis, the disclosure of which is incorporated herein by reference.

In addition to determining voltage, current and transistor characteristics, the user may desire to determine the capacitance of a device under test, in particular a capacitor of unknown capacitance. The capacitor may be attached to one or more inputs generally shown as inputs 15 in FIG. 2. The particular terminal used is known to those skilled in the art and may include a first test terminal and a second terminal connected to ground.

Suitable circuitry is arranged to charge the unknown capacitor from a DC source and to discharge the capacitor through a constant current circuit so that the discharge voltage across the capacitor decreases linearly from its initial value to zero. The linear discharge provides a time interval that is independent of the source voltage and other parameters and depends solely upon the discharge resistance in the constant current discharge circuit. Thus a simple relation for the value of the capacitance can be established as a constant factor times the time interval it takes for the capacitor to discharge. By suitable measurement of the time interval and indicating on an appropriate scale its relation to a range of capacitance values, the actual value of the capacitor can be determined. Details of the operation and structure of the capacitance measurement circuit are contained in related copending application Ser. No. 07/858,857, entitled "Battery Operated Capacitance Measurement Circuit", by Jerry J. Heep and Douglas R. Curtis, the disclosure of which is incorporated herein by reference.

Thus, the present invention provides several advantages not present in the prior art through the use of a keyboard or other input device and microprocessor control. The microprocessor is more fully utilized in the present invention not only to control the display of the measured parameters but also to control the setup of the resistor and switch network to respond to selection of different functions and selection of different ranges within which the parameters of those functions will be measured.

The present invention eliminates the need in prior art devices of a rotary or slide switch to perform the same function. In addition, the present invention provides a simple and elegant means of overload protection to protect against burnout or damage to circuit elements in the multimeter without resort to expensive high voltage switches, in order that users' mistakes in selection of ranges of expected parameters in a device under test may be accommodated without causing the meter to be damaged. The provision of the overload protection of the present invention also improves the safety of the device for users compared with the prior art devices.

Finally, the flexibility of the control by keyboard input allows the user to quickly shift from one measurement parameter to another measurement parameter without causing damage to the multimeter through inadvertent movement of a rotary or slide switch out of a given range.

The present invention also facilitates a three lead connection mode to the device under test of a near simultaneous measurement of a plurality of parameters a feature not present in the prior art.

While the present invention has been described and illustrated in the present specification and drawings this should not be interpreted as limiting the scope of the invention. Numerous modifications may be made in the construction of the preferred embodiment disclosed herein without departing from the spirit of the invention as defined in the claims.

What is claimed is:

1. Measuring apparatus for measuring values of electrical parameters of a device under test, the apparatus comprising:
   at least one input terminal adapted for connection to the device under test;
   a selection unit for selecting electrical parameters to be measured;
   a programmable controller controlled by the selection unit;
   a resistive divider network controlled by the programmable controller, the network being operatively connected to the at least one input terminal, the programmable controller configuring the network for measurement of the value of a parameter of the device under test and generating a meter output signal indicative thereof; and
   display means responsive to the meter output signal for displaying the value of the selected electrical parameter measured.

2. The measuring apparatus of claim 1, wherein the programmable controller configures the network in response to selection of parameters by the selection unit for measuring different parameters.

3. The measuring apparatus of claim 2, wherein the measuring apparatus is a multimeter and the electrical parameters to be measured are voltage, current, resistance and capacitance of the device under test.

4. The measuring apparatus of claim 2, wherein the resistive divider network includes a plurality of switches controlling a network of resistors and wherein the programmable controller controls the switches to configure the network.

5. The measuring apparatus of claim 1, wherein the selection unit is a keyboard unit.

6. The measuring apparatus of claim 1, wherein the programmable controller is a microprocessor.

7. The measuring apparatus of claim 6, and wherein the microprocessor controls the display means to display the value of the parameter measured.

8. The measuring apparatus of claim 1, wherein the network is an analog network and the parameter measured is a value in an analog form, further comprising an analog to digital converter, the converter being operatively connected to the network and to the programmable controller, the converter converting the analog value of the parameter measured to a digital form for the programmable controller.

9. The measuring apparatus of claim 1, wherein the at least one input terminal comprises an input line for measuring voltage of the device under test, the input line being operatively connected to the resistive divider network.

10. The measuring apparatus of claim 9, further comprising an input impedance operatively connected to the input line and a clamping network operatively connected to the input impedance.

11. The measuring apparatus of claim 9, further comprising a current limiting resistor and a clamping network operatively connected to the input line.

12. The measuring apparatus of claim 9, further comprising a program to control the programmable controller, the program containing instructions for converting a value of a voltage measured to a value into a decibel value.

13. The measuring apparatus of claim 1, wherein the at least one input terminal comprises a common terminal branching to an input line for measuring AC voltage of the device under test and to an input line for measuring DC voltage of the device under test, the input lines being operatively connected to the resistive divider network.

14. The measuring apparatus of claim 13, wherein the AC input line for measuring AC voltage is connected to the input terminal through a capacitive device and a resistive device, and further comprising a clamping network connected to the AC input line.

15. The measuring apparatus of claim 14, wherein the DC input line for measuring DC voltage is connected to the input terminal through a resistive device, and further comprising a clamping network connected to the DC input line.

16. The measuring apparatus of claim 15, wherein the resistive value of the resistive device of the AC line is on the order of ten times the resistive value of the resistive device of the DC line.

17. The measuring apparatus of claim 1, wherein the values measured may be measured within ranges, the selection unit further comprising means for selecting the range of measured values.

18. The measuring apparatus of claim 17, further including an interface circuit providing communication between the programmable controller and the network, and wherein the programmable controller configures the network by communication therewith by way of the interface circuit for a selected parameter and a selected range of values of that parameter.

19. The measuring apparatus of claim 17 wherein the programmable controller includes means for automatically selecting a range of measured values.

20. The measuring apparatus of claim 19 wherein the means for automatically selecting a range of values selects a range of values for a measured parameter under the control of a program.

21. The measuring apparatus of claim 20, wherein the programmable controller first selects the largest range contained in the program, and if the measured value of the parameter does not fall within the largest range, the programmable controller next selects the largest range and then the next largest range until the measured value falls within range selected for measurement.

22. The measuring apparatus of claim 1, wherein the at least one input terminal comprises an input line for measuring current of the device under test, the input line being operatively connected to the resistive divider network.

23. The measuring apparatus of claim 1, wherein the at least one input terminal comprises an input line for measuring resistance of the device under test, the input line being operatively connected to the resistive divider network.

24. The measuring apparatus of claim 1, wherein the measuring apparatus is a multimeter and the electrical parameters to be measured are voltage, current, resistance and capacitance of the device under test, further comprising a plurality of input terminals, selected ones of the plurality of input terminals being selectively connected to the divider network by the selection unit and the programmed controller to measure selected ones of the electrical parameters.

25. The measuring apparatus of claim 1, further including an interface circuit providing communication between the programmable controller and the network, and wherein the programmable controller configures the network by communication therewith by way of the interface circuit for a selected parameter and a selected range of values of that parameter.

* * * * *